(12) United States Patent
Kuramochi et al.

(10) Patent No.: US 8,094,053 B2
(45) Date of Patent: Jan. 10, 2012

(54) SIGNAL GENERATING APPARATUS AND TEST APPARATUS

(75) Inventors: Yasuhide Kuramochi, Gunma (JP);
Kouichiro Uekusa, Miyagi (JP);
Masayuki Kawabata, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/635,169

(22) Filed: Dec. 10, 2009

(65) Prior Publication Data

US 2011/0140938 A1    Jun. 16, 2011

(51) Int. Cl.
*H03M 1/66*    (2006.01)
(52) U.S. Cl. ........................................ 341/144; 341/155
(58) Field of Classification Search .................. 341/144, 341/155, 143, 120, 118
See application file for complete search history.

(56) References Cited

U.S. PATENT DOCUMENTS

| | | | |
|---|---|---|---|
| 5,796,359 A * | 8/1998 | Beard | 341/143 |
| 6,637,008 B1 | 10/2003 | Higuchi et al. | |
| 7,372,389 B2 * | 5/2008 | Whittaker | 341/155 |
| 7,583,218 B2 * | 9/2009 | Kuramochi | 341/155 |
| 7,903,008 B2 * | 3/2011 | Regier | 341/142 |
| 2005/0206545 A1 * | 9/2005 | Kobayashi et al. | 341/145 |
| 2007/0057773 A1 * | 3/2007 | Hsieh et al. | 340/10.41 |

FOREIGN PATENT DOCUMENTS

JP    2000-156627 A    6/2000
JP    2007-285764 A    11/2007

* cited by examiner

*Primary Examiner* — Peguy Jean Pierre
(74) *Attorney, Agent, or Firm* — Chen Yoshimura LLP

(57) ABSTRACT

Provided is a signal generating apparatus comprising a DA converter that outputs an output signal corresponding to input data supplied thereto; a sample/hold unit that is provided between the DA converter and an output end of the signal generating apparatus, and that samples an output voltage of the DA converter and holds the sampled output voltage; a comparing section that compares (i) a level of a signal output from an analog circuit that propagates the output signal to output a signal corresponding to the input data to (ii) a level of the signal output by the DA converter; and a control section that, during a holding period, (iii) provides the DA converter with comparison data instead of the input data to cause the DA converter to output a comparison voltage corresponding to the comparison data, (iv) causes the comparing section to compare a voltage of the signal output by the analog circuit to the comparison voltage, and (v) adjusts the output voltage of the DA converter based on a comparison result of the comparing section.

20 Claims, 8 Drawing Sheets

SIGNAL GENERATING APPARATUS AND TEST APPARATUS

BACKGROUND

1. Technical Field

The present invention relates to a signal generating apparatus and a test apparatus.

2. Related Art

A signal generating apparatus is known that outputs an analog signal corresponding to data supplied thereto. When the signal output from the signal generating apparatus is supplied to a target circuit via an analog circuit such as a filter, the analog circuit causes distortion, attenuation, and the like. By outputting a signal in which the distortion and attenuation caused by the analog circuit is compensated for in advance, the signal generating apparatus can supply the target circuit with a signal having the desired waveform.

In order to compensate for distortion and attenuation caused by the analog circuit, the signal generating apparatus must measure in advance the transfer characteristics of the analog circuit using an AD converter. However, providing the signal generating apparatus with an AD converter results in a larger structure and a higher cost.

Patent Document 1: Japanese Patent Application Publication No. 2007-285764

Patent Document 2: Japanese Patent Application Publication No. 2000-156627

SUMMARY

Therefore, it is an object of an aspect of the innovations herein to provide a signal generating apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary signal generating apparatus and test apparatus may include (i) a signal generating apparatus comprising a DA converter that outputs an output signal corresponding to input data supplied thereto; a comparing section that compares a level of a signal output from an analog circuit that propagates the output signal to output a signal corresponding to the input data to a level of the signal output by the DA converter; and a measuring section that measures a waveform of the signal output by the analog circuit based on a comparison result of the comparing section and (ii) a test apparatus provided with the signal generating apparatus The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
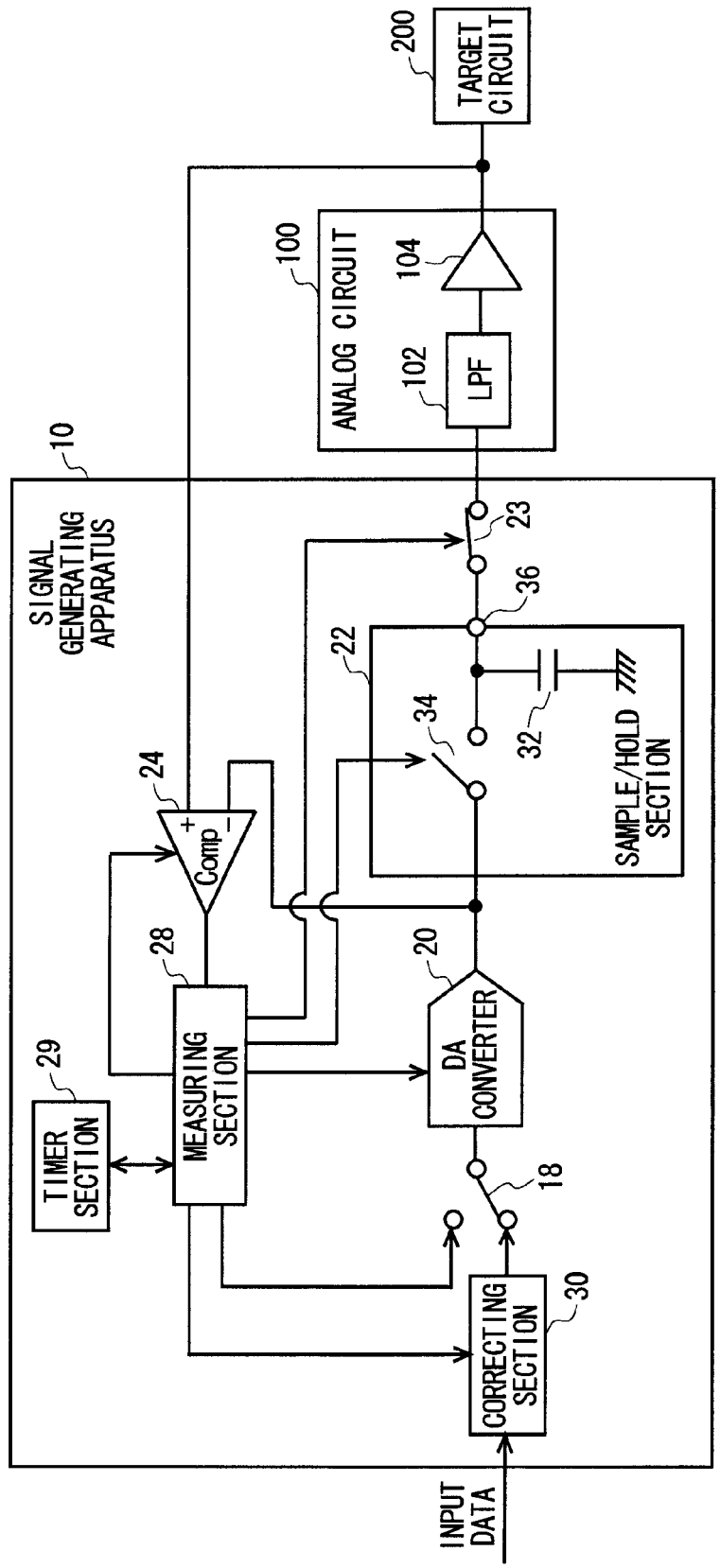
FIG. 1 shows a configuration of a signal generating apparatus 10 according to an embodiment of the present invention, along with an analog circuit 100 and a target circuit 200.

FIG. 1 shows a configuration of a signal generating apparatus 10 according to an embodiment of the present invention, along with an analog circuit 100 and a target circuit 200. The signal generating apparatus 10 outputs an output signal having a level that corresponds to input data supplied from the outside. In the present embodiment, the signal generating apparatus 10 outputs an output voltage that corresponds to the input data.

The output signal from the signal generating apparatus 10 is supplied to the target circuit 200 via the analog circuit 100. The analog circuit 100 propagates the output signal and outputs a signal corresponding to the input data. The analog circuit 100 may be a transmission line, for example. The analog circuit 100 may include a low-pass filter 102 that eliminates a high frequency component from the output signal and a buffer amplifier 104 that supplies the target circuit 200 with the signal output from the low-pass filter 102.

The analog circuit 100 may be formed integrally with the signal generating apparatus 10 on the same chip or substrate. The analog circuit 100 may instead be provided within the signal generating apparatus 10.

The signal generating apparatus 10 performs a calibration prior to or during signal generation. During calibration, the signal generating apparatus 10 measures the settling waveform that occurs when the analog circuit 100 is supplied with a setting voltage according to setting data. The settling waveform is, for example, the waveform of the signal output by the analog circuit 100 from when the setting voltage is supplied to when the waveform stabilizes. The signal generating apparatus 10 adjusts a correction amount for the output signal from the DA converter 20 to compensate in advance for the distortion and attenuation in the signal due to the analog circuit 100, based on the measured settling waveform.

The signal generating apparatus 10 includes a data switching section 18, a DA converter 20, a sample/hold section 22, an output switching section 23, a comparing section 24, a measuring section 28, a timer section 29, and a correcting section 30. During signal generation, the data switching section 18 selects input data supplied from the outside and supplies the selected input data to the DA converter 20. During calibration, the data switching section 18 selects output data from the measuring section 28 and supplies the selected output data to the DA converter 20.

The DA converter 20 outputs a signal corresponding to the data supplied thereto. In the present embodiment, during signal generation, the DA converter 20 outputs a voltage corresponding to input data supplied from the outside and, during calibration, outputs a voltage corresponding to data supplied from the measuring section 28. The DA converter 20 may be a charge redistribution DA converter, for example.

The sample/hold section 22 is provided downstream from the DA converter 20. The sample/hold section 22 samples the voltage output from the DA converter 20 and holds the sampled voltage. Furthermore, the sample/hold section 22 can reset the held voltage to a reference voltage.

The sample/hold section 22 may include a capacitor section 32 and a switch 34. The capacitor section 32 is provided between the output end 36 of the sample/hold section 22 and a reference potential, such as a ground.

The switch 34 provides a connection or a disconnect between the DA converter 20 and the output end 36 of the sample/hold section 22. More specifically, the switch 34 connects the DA converter 20 to the output end 36 of the sample/hold section 22 during a sampling period. Furthermore, the switch 34 disconnects the DA converter 20 from the output end 36 of the sample/hold section 22 during a holding period.

This sample/hold section 22 can connect the DA converter 20 to the output end 36 of the sample/hold section 22 during the sampling period to sample the output voltage from the DA converter 20 in the capacitor section 32. Furthermore, the sample/hold section 22 can disconnect the DA converter 20 from the output end 36 of the sample/hold section 22 during the holding period to output the output voltage sampled in the capacitor section 32 from the output end 36.

The sample/hold section 22 may function during calibration and need not function during signal generation. In other words, during signal generation, the sample/hold section 22 need not sample the voltage output from the DA converter 20. For example, the signal generating apparatus 10 may include a switching section that bypasses the sample/hold section 22 and directly connects the DA converter 20 to the analog circuit 100 during signal generation.

During calibration, the output switching section 23 provides a connection or a disconnect between the output end 36 of the sample/hold section 22 and the analog circuit 100. In the holding period during calibration, the output switching section 23 connects the output end 36 of the sample/hold section 22 to the analog circuit 100. In the sampling period during calibration, the output switching section 23 disconnects the output end 36 of the sample/hold section 22 from the analog circuit 100. In this way, the output switching section 23 can apply the voltage held by the sample/hold section 22 to the analog circuit 100 at a designated timing.

The comparing section 24 receives the signal output by the analog circuit 100. The comparing section 24 compares the level of the signal output by the analog circuit 100 to the level of the signal output by the DA converter 20. In the present embodiment, the comparing section 24 compares the voltage of the signal output by the analog circuit 100 to the voltage of the signal output by the DA converter 20, and outputs a comparison result indicating which of these voltages is larger.

The measuring section 28 controls whether the switch 34 is connected or disconnected to control the timing of the sampling period and the holding period of the sample/hold section 22. Furthermore, the measuring section 28 controls whether the output switching section 23 is connected or disconnected to control whether voltage is supplied to the analog circuit 100. The measuring section 28 also controls the comparison timing of the comparing section 24.

During calibration, the measuring section 28 generates the data to be supplied to the DA converter 20. The measuring section 28 controls the data switching section 18 to switch whether the input data received from the outside or the data generated by the measuring section 28 is supplied to the DA converter 20.

Furthermore, during calibration, the measuring section 28 measures the waveform of the signal output by the analog circuit 100 based on the comparison result of the comparing section 24. The process flow for measuring the waveform of the signal output by the analog circuit 100 is described in detail further below.

The timer section 29 measures the time according to instructions from the measuring section 28. The correcting section 30 corrects the output signal from the DA converter 20 during signal generation based on the waveform measured by the measuring section 28 during calibration. A detailed example of the correction method is provided further below.

Figure 2:
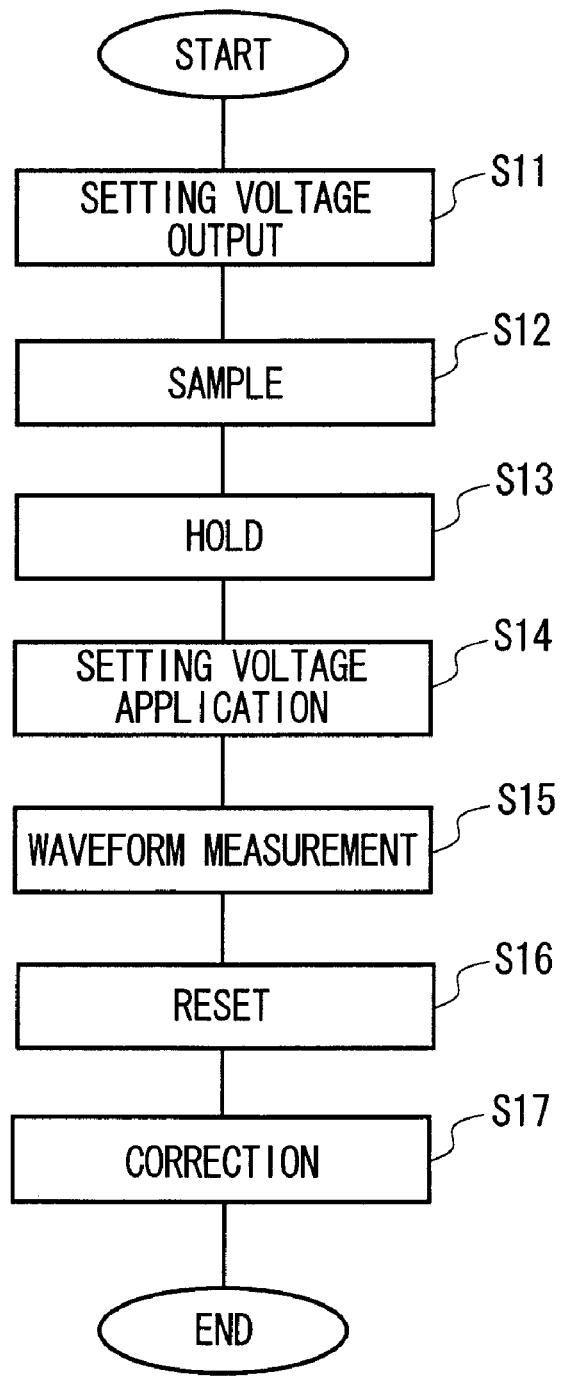
FIG. 2 shows the flow for measuring a voltage waveform of the signal output from the analog circuit 100 during calibration of the signal generating apparatus 10 according to the present embodiment.

FIG. 2 shows the flow for measuring a voltage waveform of the signal output from the analog circuit 100 during calibration of the signal generating apparatus 10 according to the present embodiment. During calibration, the measuring section 28 measures the voltage waveform output by the analog circuit 100 according to the flow shown in FIG. 2.

First, the measuring section 28 supplies the DA converter 20 with predetermined setting data to cause the DA converter 20 to output a setting voltage corresponding to the setting data (S11). Next, the measuring section 28 causes the sample/hold section 22 to sample the setting voltage output by the DA converter 20 according to the setting data (S12). More specifically, the measuring section 28 connects the switch 34 of the sample/hold section 22 to charge the capacitor section 32 with the setting voltage output by the DA converter 20.

When the sample/hold section 22 samples the setting voltage, the measuring section 28 disconnects the output switching section 23 to disconnect the output end 36 of the sample/hold section 22 from the analog circuit 100. In this way, during the sampling period, the measuring section 28 can prevent the setting voltage output by the DA converter 20 from being applied to the analog circuit 100.

Next, the measuring section 28 causes the sample/hold section 22 to hold the sampled setting voltage (S13). More specifically, the measuring section 28 disconnects the switch 34 of the sample/hold section 22 so that the setting voltage charged in the capacitor section 32 is output from the output end 36.

Next, during the holding period of the sample/hold section 22, the measuring section 28 supplies the setting voltage held by the sample/hold section 22 to the analog circuit 100 (S14). More specifically, the measuring section 28 connects the output switching section 23 so that the output end 36 of the sample/hold section 22 is connected to the analog circuit 100. Upon receiving the setting voltage, the analog circuit 100 outputs a signal that gradually increases or decreases from a reference voltage to a prescribed voltage, such as the setting voltage.

Next, the measuring section 28 measures the settling waveform of the signal output from the analog circuit 100 in response to the supply of the setting voltage (S15). A detailed method for measuring the settling waveform using the measuring section 28 is described further below.

Next, the measuring section 28 resets the sample/hold section 22 (S16). More specifically, the measuring section 28 connects the output end 36 of the sample/hold section 22 to a reference voltage, such as a ground, to release the charge stored in the capacitor section 32.

Next, the measuring section 28 calculates the transfer characteristic of the analog circuit 100 based on the measured settling waveform. The measuring section 28 then adjusts the correction amount of the output signal from the DA converter 20 during signal generation based on the calculated transfer characteristic of the analog circuit 100. For example, the measuring section 28 may adjust the correction amount of the signal output by the DA converter 20 to output a signal in which the distortion, attenuation, and the like caused by the analog circuit 100 is compensated for in advance. An example of a detailed adjustment method is provided further below.

The signal generating apparatus 10 described above can, during signal generation, supply the analog circuit 100 with a signal corresponding to the input data via the target circuit 200. Furthermore, during calibration, the signal generating apparatus 10 can measure the waveform of the signal output from the analog circuit 100 when the analog circuit 100 is supplied with the setting voltage, without using an AD converter.

Figure 3:
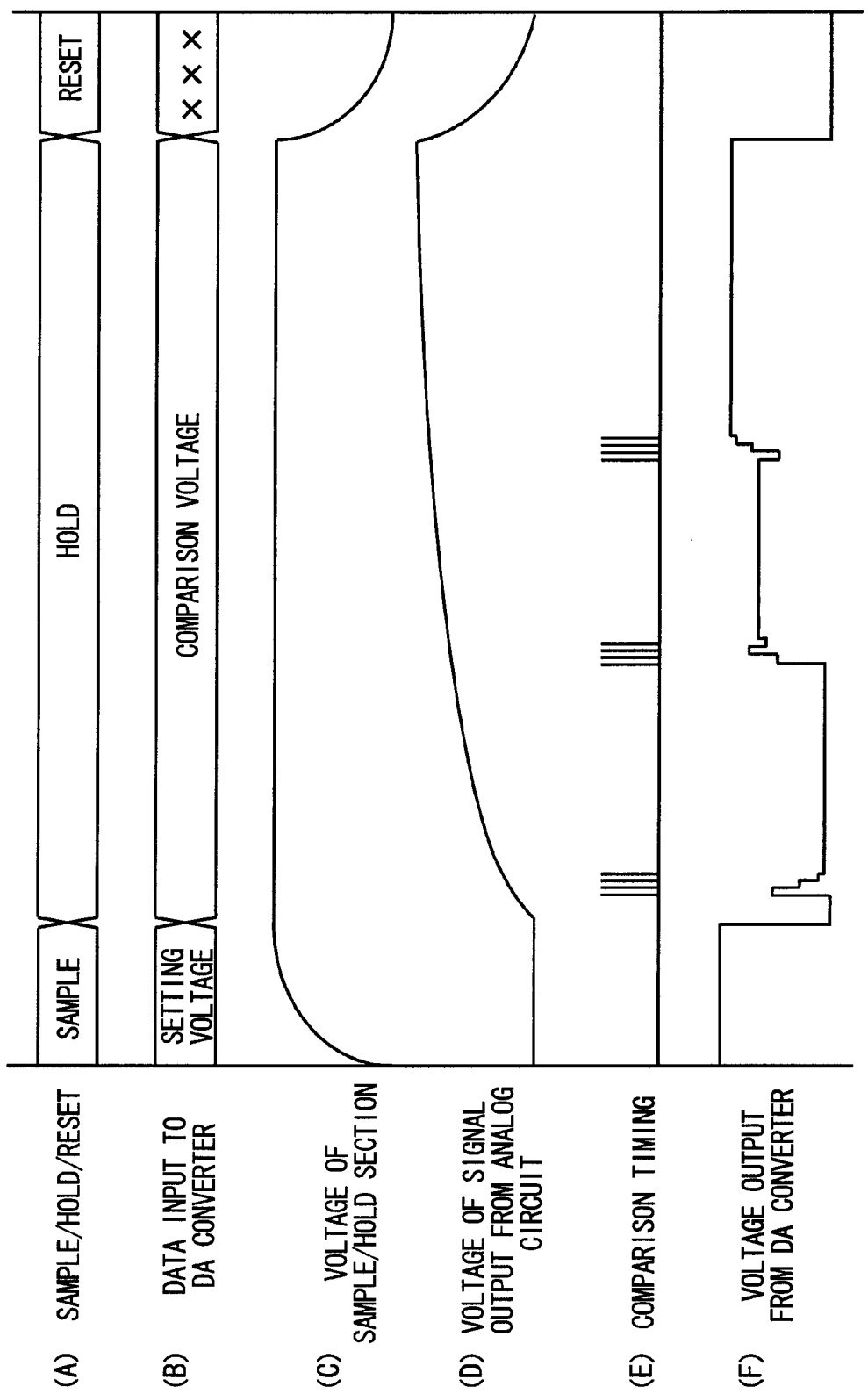
FIG. 3 shows first examples of the waveform of each signal in the signal generating apparatus 10 and a timing chart according to the present embodiment, during calibration.

FIG. 3 shows first examples of the waveform of each signal in the signal generating apparatus 10 and a timing chart according to the present embodiment, during calibration. As shown by (A) and (B) in FIG. 3, the measuring section 28 causes the DA converter 20 to output the setting voltage corresponding to the setting data, and causes the sample/hold section 22 to perform the sampling operation. Next, the measuring section 28 causes the sample/hold section 22 to perform the holding operation, and supplies the analog circuit 100 with the setting voltage held by the sample/hold section 22.

Here, when the setting voltage held by the sample/hold section 22 is supplied to the analog circuit 100, the voltage of the signal output from the analog circuit 100 gradually increases or decreases from a reference potential, such as the ground potential, until reaching a prescribed voltage, such as the setting voltage, as shown by (D) in FIG. 3. The measuring section 28 measures this type of settling waveform during the holding period.

More specifically, during the holding period, the measuring section 28 causes the DA converter 20 to output the comparison voltage corresponding to the comparison data by supplying the comparison data thereto, as shown by (B) in FIG. 3, and causes the comparing section 24 to compare the voltage of the signal output by the analog circuit 100 to the comparison voltage. The measuring section 28 then measures the settling waveform based on the comparison result of the comparing section 24.

For example, as shown by (E) and (F) in FIG. 3, at each of one or more predetermined measurement timings during the holding period, the measuring section 28 causes the comparing section 24 to compare the voltage of the signal output by the analog circuit 100 to the comparison voltage, and detects the voltage of the signal output by the analog circuit 100 based on the comparison result from the comparing section 24. For example, at each of one or more predetermined measurement timings during the holding period, the measuring section 28 may quickly change the comparison data according to the rules of a binary search and supply this comparison data to the DA converter 20 to detect the voltage of the signal output from the analog circuit 100.

The measuring section 28 measures the settling waveform based on the detected voltage. For example, the measuring section 28 may measure the settling waveform based on (i) the amount of time from a reference time to each measurement timing, e.g. from the timing at which the setting voltage is supplied to each measurement timing, and (ii) the voltage detected at each measurement timing. The measuring section 28 may calculate the settling waveform by substituting the detected voltages and measurement timings into a preset formula, or may retrieve an approximated settling waveform by referencing a table or the like in which a plurality of settling waveforms are recorded in advance, for example.

The settling time, which is the time from when the waveform has the reference potential to when the waveform reaches a prescribed potential such as the setting voltage, increases as the time constant of the analog circuit 100 increases. Accordingly, the time constant of the sample/hold section 22 is desirably less than the time constant of the analog circuit 100. As a result, the measuring section 28 can accurately measure the settling waveform since the voltage change of the signal output from the analog circuit 100 is gradual.

Figure 4:
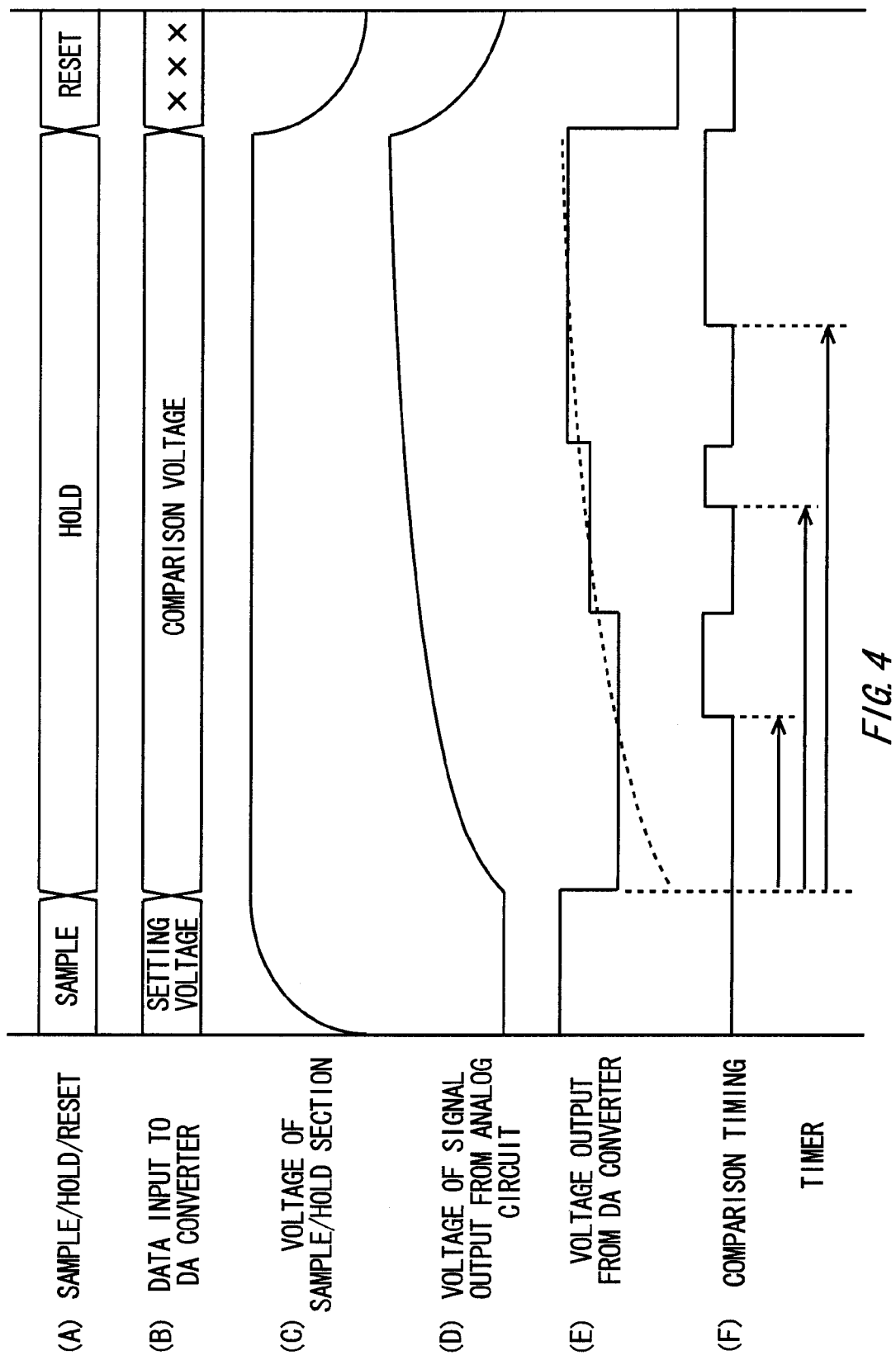
FIG. 4 shows second examples of the waveform of each signal in the signal generating apparatus 10 and a timing chart according to the present embodiment, during calibration.

FIG. 4 shows second examples of the waveform of each signal in the signal generating apparatus 10 and a timing chart according to the present embodiment, during calibration. The measuring section 28 can measure the settling waveform as shown in FIG. 4, for example.

Here, the measuring section 28 may supply the DA converter 20 with first comparison data to cause the DA converter 20 to output a first comparison voltage during the holding period, as shown by (E) and (F) in FIG. 4. The measuring section 28 then causes the comparing section 24 to compare the voltage of the signal output by the analog circuit 100 to the first comparison voltage, to detect a first change timing at which the measurement result of the comparing section 24 changes. For example, the measuring section 28 causes the timer section 29 to measure the amount of time from the reference time, e.g. the time at which the setting voltage is supplied to the analog circuit 100, to the first change timing.

Furthermore, after the comparison result between the voltage of the signal output from the analog circuit 100 and the first comparison voltage has changed, the measuring section 28 supplies the DA converter 20 with second comparison data so that the DA converter 20 outputs a second comparison voltage. The second comparison voltage may be higher than the first comparison voltage if the voltage of the signal output by the analog circuit 100 increases, and may be lower than the first comparison voltage if the voltage of the signal output by the analog circuit 100 decreases.

The measuring section 28 causes the comparing section 24 to compare the voltage of the signal output by the analog circuit 100 to the second comparison voltage, to detect a second change timing at which the comparison result of the comparing section 24 changes. For example, the measuring section 28 may cause the timer section 29 to measure the amount of time from the reference time to the second change timing.

In the same way, the measuring section 28 may cause the DA converter 20 to output third, fourth, fifth, etc. comparison voltages, and detect third, fourth, fifth, etc. change timings. In this way, the measuring section 28 can detect the timing (change timing) at which the voltage of the signal output by the analog circuit 100 exceeds each of one or more predetermined comparison voltages.

The measuring section 28 then measures the settling waveform further based on the detected first change timing, the first comparison voltage, the detected second change timing, and the second comparison voltage. In other words, the measuring section 28 measures the settling waveform based on one or more set comparison voltages and one or more detected change timings. For example, the measuring section 28 may calculate the settling waveform by substituting the detected change timings and set comparison voltages into a preset formula, or may retrieve an approximated settling waveform by referencing a table or the like in which a plurality of settling waveforms are recorded in advance, for example.

Figure 5:
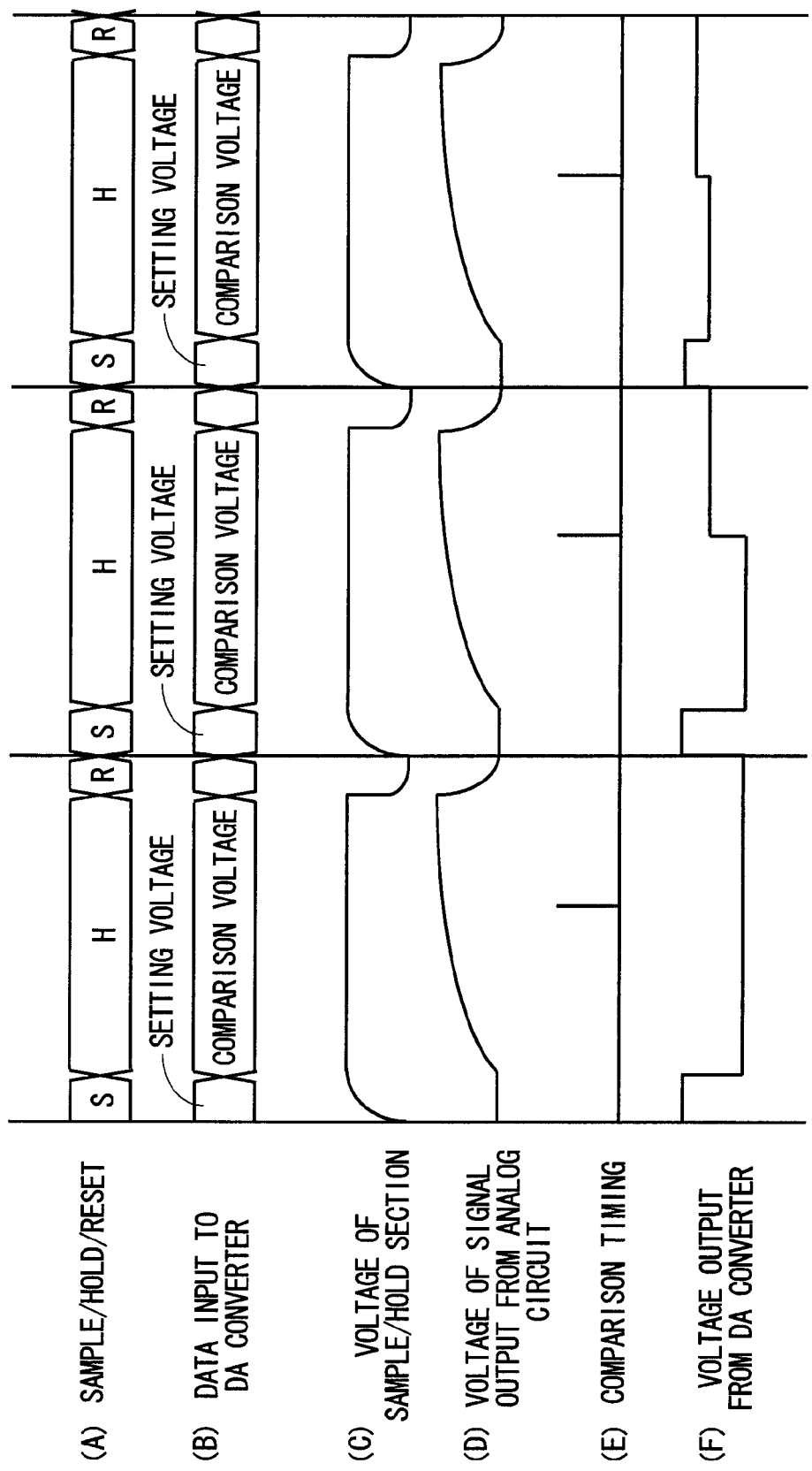
FIG. 5 shows third examples of the waveform of each signal in the signal generating apparatus 10 and a timing chart according to the present embodiment, during calibration.

FIG. 5 shows third examples of the waveform of each signal in the signal generating apparatus 10 and a timing chart according to the present embodiment, during calibration. The measuring section 28 can measure the settling waveform as shown in FIG. 5, for example.

Here, the measuring section 28 repeatedly supplies the DA converter 20 with the same setting data, as shown by (A) and (B) in FIG. 5. As shown by (C) in FIG. 5, for each of a plurality of cycles in which the same setting data is supplied, the sample/hold section 22 samples the voltage of the signal output by the DA converter 20 and holds the sampled voltage.

For each cycle, the sample/hold section 22 supplies the analog circuit 100 with the same setting voltage. In this way, the analog circuit 100 outputs a signal with the same settling waveform in each cycle, as shown by (D) in FIG. 5.

Furthermore, at the first measurement timing in the holding period in each cycle, i.e. at a timing at the same phase in each holding period, the measuring section 28 provides the DA converter 20 with comparison data that differs for each cycle, so that the DA converter 20 outputs different comparison voltage. For each cycle, the measuring section 28 causes the comparing section 24 to compare the comparison voltage and the voltage of the signal output by the analog circuit 100.

The measuring section 28 detects the voltage of the signal output by the analog circuit 100 at the first measurement timing based on the comparison results acquired in the plurality of cycles. For example, the measuring section 28 changes the comparison data in each cycle according to the rules of a binary search, supplies the DA converter 20 with this comparison data, and detects the voltage of the signal output from the analog circuit 100.

Therefore, even when the voltage change of the signal output from the analog circuit 100 is relatively fast compared to the sampling clock of the DA converter 20, the measuring section 28 can accurately measure the settling waveform.

Figure 6:
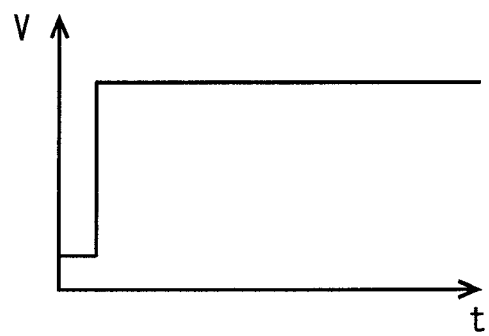
FIG. 6 shows an exemplary voltage waveform of the signal output by the signal generating apparatus 10 when correction is not performed.
Figure 7:
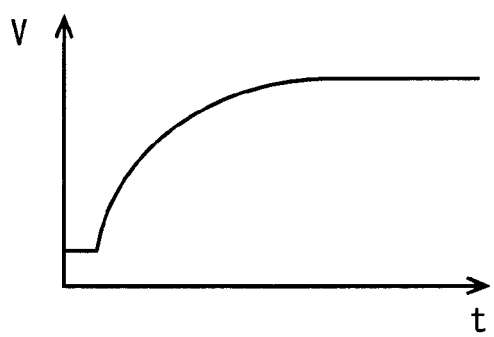
FIG. 7 shows an exemplary voltage waveform of the signal output by the analog circuit 100 when the signal with the voltage waveform shown in FIG. 6 is supplied thereto.
Figure 8:
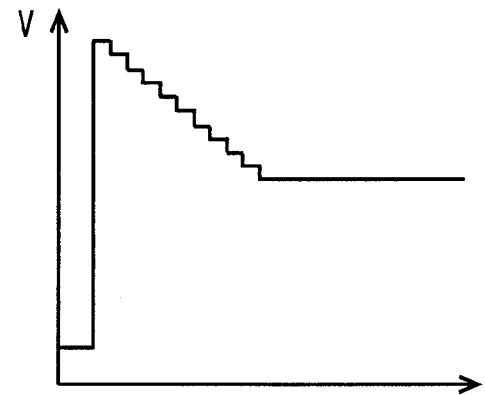
FIG. 8 shows an exemplary voltage waveform of the signal output by the signal generating apparatus 10 when correction is performed.
Figure 9:
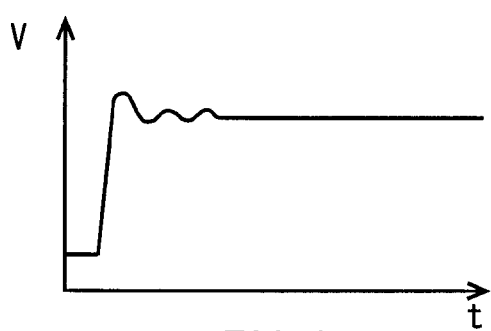
FIG. 9 shows an exemplary voltage waveform of the signal output by the analog circuit 100 when the signal with the voltage waveform shown in FIG. 8 is supplied thereto.

FIG. 6 shows an exemplary voltage waveform of the signal output by the signal generating apparatus 10 when correction is not performed. FIG. 7 shows an exemplary voltage waveform of the signal output by the analog circuit 100 when the signal with the voltage waveform shown in FIG. 6 is supplied thereto. FIG. 8 shows an exemplary voltage waveform of the signal output by the signal generating apparatus 10 when correction is performed. FIG. 9 shows an exemplary voltage waveform of the signal output by the analog circuit 100 when the signal with the voltage waveform shown in FIG. 8 is supplied thereto.

It is assumed that the DA converter 20 supplies the analog circuit 100 with a signal having a stepped voltage waveform from, such as shown in FIG. 6. If the analog circuit 100 is a transmission line, the high-frequency component of the signal passing therethrough is attenuated. Accordingly, the voltage waveform of the signal output by the analog circuit 100 has a dulled edge, as shown in FIG. 7, for example. When the analog circuit 100 is a transmission line, the measuring section 28 can measure such a waveform during calibration, for example.

Here, the correcting section 30 compensates the component of the output signal from the DA converter 20 that is attenuated by the analog circuit 100, according to a response characteristic of the analog circuit 100 that is calculated based on the waveform measured by the measuring section 28. For example, when the analog circuit 100 is a transmission path, the correcting section 30 may cause the DA converter 20 to output a signal that is obtained by adding, to the signal corresponding to the input data, an enhancement signal that enhances the high-frequency component of this signal.

For example, when the analog circuit 100 has response characteristics such as shown in FIG. 7 and the input data indicates a stepped waveform, the correcting section 30 causes the DA converter 20 to output a signal such as shown in FIG. 8. As a result, as shown in FIG. 9, the analog circuit 100 can output a signal with a stepped waveform that quickly settles to a voltage corresponding to the input data. In this way, the signal generating apparatus 10 of the present embodiment can supply the target circuit 200 with a signal having the desired voltage waveform, regardless of the distortion, attenuation, or the like of the analog circuit 100.

The correcting section 30 performs the correction by performing a digital computation on the input data supplied from the outside, and supplies the corrected data to the DA converter 20. In this way, the correcting section 30 can relatively easily adjust the voltage waveform of the signal output by the DA converter 20.

The correcting section 30 or the measuring section 28 may include a signal generating section that generates a correction signal according to the input data supplied thereto, and an adding section that adds the correction signal to the signal output from the DA converter 20. In this way, the correcting section 30 can perform the correction with a small delay amount. The correction method of the correcting section 30 is not limited to the methods described above, and other methods may be used to correct the waveform of the signal output from the DA converter 20.

Figure 10:
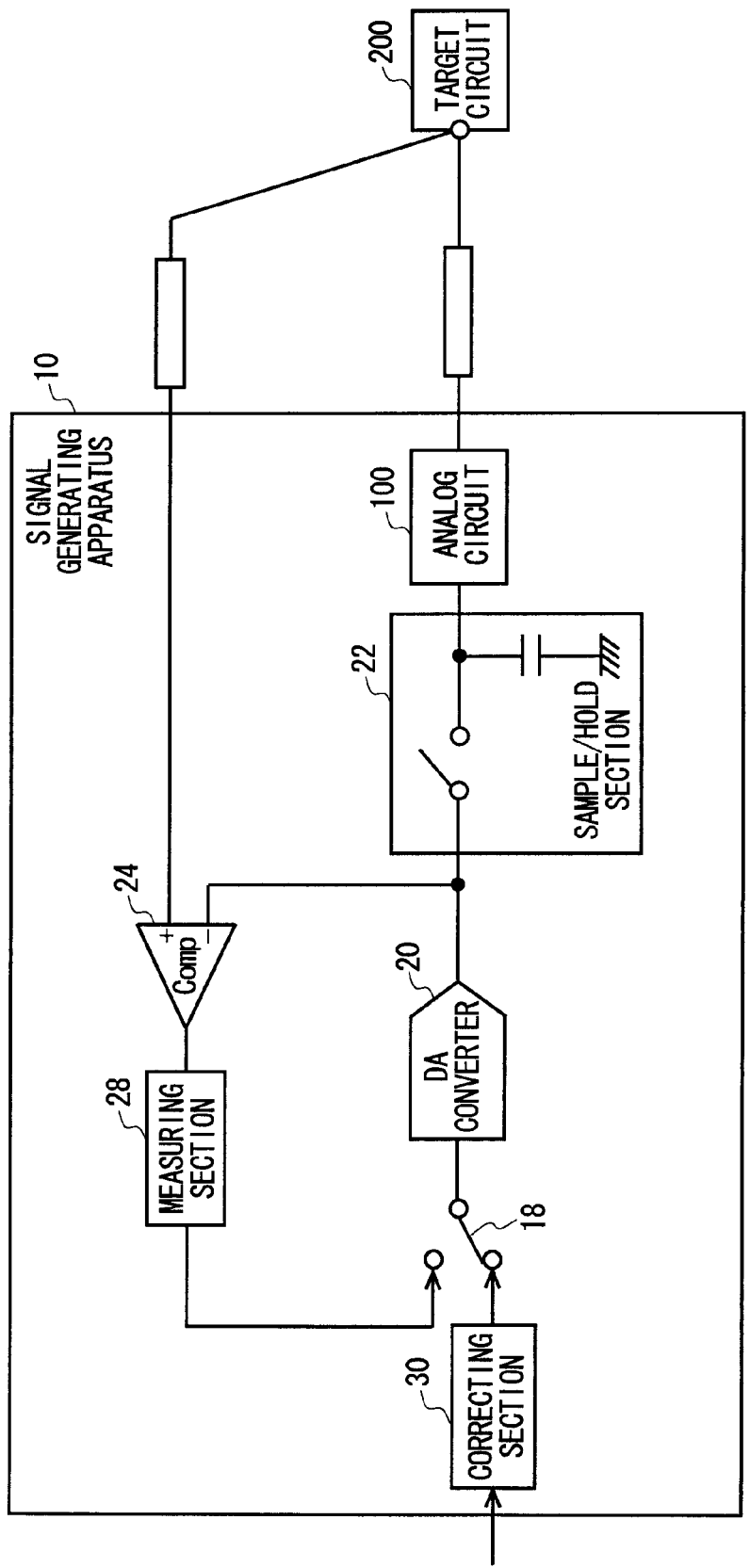
FIG. 10 shows a configuration of the signal generating apparatus 10 according to a modification of the present embodiment.

FIG. 10 shows a configuration of the signal generating apparatus 10 according to a modification of the present embodiment, along with the target circuit 200. The signal generating apparatus 10 of the present modification adopts substantially the same function and configuration as the signal generating apparatus 10 shown in FIG. 1, and components of the signal generating apparatus 10 of the present modification have the same function and configuration as components having the same reference numerals in the signal generating apparatus 10 of FIG. 1. Therefore, the following description includes only differing points.

In the present embodiment, the signal generating apparatus 10 includes the analog circuit 100 therein. The analog circuit 100 propagates the output voltage from the DA converter 20 to an input end of the target circuit 200. The comparing section 24 compares the voltage of the input end of the target circuit 200 to the comparison voltage output from the DA converter 20.

The signal generating apparatus 10 of the present modification can accurately generate the voltage corresponding to the input data at the input end of the target circuit 200. Accordingly, the signal generating apparatus 10 of the present modification can accurately apply a signal having the desired waveform to the target circuit 200.

Figure 11:
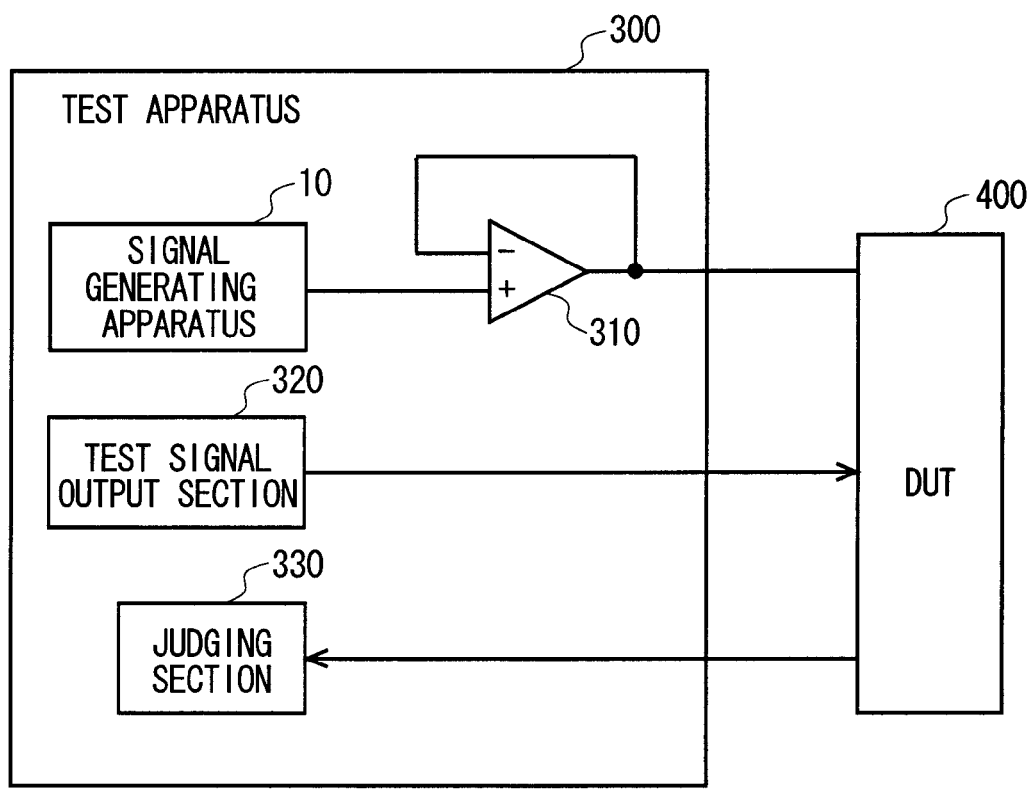
FIG. 11 shows a configuration of a test apparatus 300 according to an embodiment of the present invention, along with a device under test 400.

FIG. 11 shows a configuration of a test apparatus 300 according to an embodiment of the present invention, along with a device under test (DUT) 400. The test apparatus 300 tests the device under test 400, which is a semiconductor apparatus or the like.

The test apparatus 300 includes the signal generating apparatus 10, a drive section 310, a test signal output section 320, and a judging section 330. The signal generating apparatus 10 generates voltage that is supplied to the device under test 400. The signal generating apparatus 10 in this embodiment has the same configuration as the signal generating apparatus 10 described in relation to FIGS. 1 to 10, and therefore further description is omitted.

The drive section 310 supplies the device under test 400 with the voltage generated by the signal generating apparatus 10. The drive section 310 may be a power amplifier, for example.

The drive section 310 may be a portion of the analog circuit 100. In other words, the comparing section 24 of the signal generating apparatus 10 may compare the voltage of the output end of the drive section 310 to the comparison voltage output from the DA converter 20.

The test signal output section 320 outputs a test signal to the device under test 400. The judging section 330 receives a response signal from the device under test 400 in response to the test signal. The judging section 330 judges acceptability of the device under test 400 based on the received response signal. The test apparatus 300 described above can supply the device under test 400 with an accurate voltage from the signal generating apparatus 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A signal generating apparatus comprising:
a DA converter that outputs an output signal corresponding to input data supplied thereto;
a comparing section that compares (i) a level of a signal output from an analog circuit that propagates the output signal to output a signal corresponding to the input data to (ii) a level of the signal output by the DA converter; and
a measuring section that measures a waveform of the signal output by the analog circuit based on a comparison result of the comparing section, wherein
the DA converter outputs a voltage corresponding to data supplied thereto,
the signal generating apparatus further comprises a sample/hold section that samples a voltage output by the DA converter and holds the sampled voltage, and
the measuring section (i) provides the DA converter with setting data to cause the DA converter to output a setting voltage corresponding to the setting data, (ii) causes the sample/hold section to sample the setting voltage, (iii) provides the analog circuit with the setting voltage held by the sample/hold section, and (iv) measures a settling waveform of the voltage of the signal output from the analog circuit, from when the setting voltage is provided to when the voltage stabilizes.

2. The signal generating apparatus according to claim 1, wherein
during a holding period in which the sampled voltage is held, the measuring section (i) provides the DA converter with comparison data to cause the DA converter to output a comparison voltage corresponding to the comparison data, (ii) causes the comparing section to compare the voltage of the signal output by the analog circuit to the comparison voltage, and (iii) measures the settling waveform based on the comparison result of the comparing section.

3. The signal generating apparatus according to claim 2, wherein
the sample/hold section includes:
a capacitor section that is provided between an output end of the sample/hold section and a reference potential; and
a switch that provides a connection between the DA converter and the output end of the sample/hold section during a sampling period in which the voltage output from the DA converter is sampled, and disconnects the DA converter from the output end of the sample/hold section during the holding period.

4. The signal generating apparatus according to claim 2, wherein
at a predetermined measurement timing in the holding period, the measuring section causes the comparing section to compare the voltage of the signal output by the analog circuit to the comparison voltage, and
the measuring section detects the voltage of the signal output by the analog circuit based on the comparison result of the comparing section, and measures the settling waveform based on the detected voltage.

5. The signal generating apparatus according to claim 4, wherein
the measuring section changes the comparison data according to rules of a binary search to detect the voltage of the signal output by the analog circuit.

6. The signal generating apparatus according to claim 2, wherein
the measuring section repeatedly provides the DA converter with the same setting data,
for each of a plurality of cycles in which the same setting data is provided, the sample/hold section samples the voltage of the signal output by the DA converter and holds the sampled voltage, and
the measuring section (i) causes the DA converter to output the comparison voltage by supplying the DA converter with comparison data that differs for each of the plurality of cycles at a first measurement timing in the holding period of each cycle and (ii) detects the voltage of the signal output by the analog circuit at the first measurement timing based on comparison results acquired by the comparing section for the plurality of cycles.

7. The signal generating apparatus according to claim 2, wherein
during the holding period, the measuring section (i) causes the DA converter to output a first comparison voltage by providing first comparison data thereto, (ii) causes the comparing section to compare the voltage of the signal output by the analog circuit to the first comparison voltage, (iii) detects a first change timing at which the comparison result of the comparing section changes, and (iv) measures the settling waveform based on the detected first change timing and the first comparison voltage.

8. The signal generating apparatus according to claim 7, wherein
during the holding period, after the comparison result between the voltage of the signal output by the analog circuit and the first comparison voltage has changed, the measuring section (i) causes the DA converter to output a second comparison voltage by providing second comparison data thereto, (ii) causes the comparing section to compare the voltage of the signal output by the analog circuit to the second comparison voltage, (iii) detects a second change timing at which the comparison result of the comparing section changes, and (iv) measures the settling waveform further based on the detected second change timing and the second comparison voltage.

9. The signal generating apparatus according to claim 1, wherein
the measuring section measures the waveform during calibration of the signal generating apparatus, and
the signal generating apparatus further comprises a correcting section that corrects the output signal from the DA converter based on the waveform measured by the measuring section.

10. The signal generating apparatus according to claim 9, wherein
the correcting section compensates a component of the output signal from the DA converter that is attenuated by the analog circuit, according to a response characteristic of the analog circuit that is calculated based on the waveform measured by the measuring section.

11. The signal generating apparatus according to claim 1, wherein
the analog circuit propagates the output voltage from the DA converter to an input end of a target circuit, and
the comparing section compares the voltage at the input end of the target circuit to the comparison voltage output by the DA converter.

12. A test apparatus that tests a device under test, comprising:
a signal generating apparatus that generates a voltage provided to the device under test; and
a drive section that supplies the device under test with the voltage generated by the signal generating apparatus, wherein
the signal generating apparatus comprises:
a DA converter that outputs an output signal corresponding to input data supplied thereto;
a comparing section that compares (i) a level of a signal output from an analog circuit that propagates the output signal to output a signal corresponding to the input data to (ii) a level of the signal output by the DA converter; and
a measuring section that measures a waveform of the signal output by the analog circuit based on a comparison result of the comparing section.

13. The test apparatus according to claim 12, wherein
the DA converter outputs a voltage corresponding to data supplied thereto,
the signal generating apparatus further comprises a sample/hold section that samples a voltage output by the DA converter and holds the sampled voltage, and
the measuring section (i) provides the DA converter with setting data to cause the DA converter to output a setting voltage corresponding to the setting data, (ii) causes the sample/hold section to sample the setting voltage, (iii) provides the analog circuit with the setting voltage held by the sample/hold section, and (iv) measures a settling waveform of the voltage of the signal output from the analog circuit, from when the setting voltage is provided to when the voltage stabilizes.

14. The test apparatus according to claim 13, wherein
during a holding period in which the sampled voltage is held, the measuring section (i) provides the DA converter with comparison data to cause the DA converter to output a comparison voltage corresponding to the comparison data, (ii) causes the comparing section to compare the voltage of the signal output by the analog circuit to the comparison voltage, and (iii) measures the settling waveform based on the comparison result of the comparing section.

15. The test apparatus according to claim 14, wherein
the sample/hold section includes:
a capacitor section that is provided between an output end of the sample/hold section and a reference potential; and
a switch that provides a connection between the DA converter and the output end of the sample/hold section during a sampling period in which the voltage output from the DA converter is sampled, and disconnects the DA converter from the output end of the sample/hold section during the holding period.

16. The test apparatus according to claim 14, wherein
at a predetermined measurement timing in the holding period, the measuring section causes the comparing section to compare the voltage of the signal output by the analog circuit to the comparison voltage, and
the measuring section detects the voltage of the signal output by the analog circuit based on the comparison result of the comparing section, and measures the settling waveform based on the detected voltage.

17. The test apparatus according to claim 14, wherein
the measuring section repeatedly provides the DA converter with the same setting data,
for each of a plurality of cycles in which the same setting data is provided, the sample/hold section samples the voltage of the signal output by the DA converter and holds the sampled voltage, and
the measuring section (i) causes the DA converter to output the comparison voltage by supplying the DA converter with comparison data that differs for each of the plurality of cycles at a first measurement timing in the holding period of each cycle and (ii) detects the voltage of the signal output by the analog circuit at the first measurement timing based on comparison results acquired by the comparing section for the plurality of cycles.

18. The test apparatus according to claim 14, wherein
during the holding period, the measuring section (i) causes the DA converter to output a first comparison voltage by providing first comparison data thereto, (ii) causes the comparing section to compare the voltage of the signal output by the analog circuit to the first comparison voltage, (iii) detects a first change timing at which the comparison result of the comparing section changes, and (iv) measures the settling waveform based on the detected first change timing and the first comparison voltage, and
during the holding period, after the comparison result between the voltage of the signal output by the analog circuit and the first comparison voltage has changed, the measuring section (v) causes the DA converter to output a second comparison voltage by providing second comparison data thereto, (vi) causes the comparing section to compare the voltage of the signal output by the analog circuit to the second comparison voltage, (vii) detects a second change timing at which the comparison result of the comparing section changes, and (viii) measures the settling waveform further based on the detected second change timing and the second comparison voltage.

19. The test apparatus according to claim 13, wherein
the measuring section measures the waveform during calibration of the signal generating apparatus, and
the signal generating apparatus further comprises a correcting section that compensates a component of the output signal from the DA converter that is attenuated by the analog circuit, according to a response characteristic of the analog circuit that is calculated based on the waveform measured by the measuring section.

20. A signal generating apparatus comprising:
a DA converter that outputs an output signal corresponding to input data supplied thereto;
a comparing section that compares (i) a level of a signal output from an analog circuit that propagates the output signal to output a signal corresponding to the input data to (ii) a level of the signal output by the DA converter; and
a measuring section that measures a waveform of the signal output by the analog circuit based on a comparison result of the comparing section.

* * * * *